U S010027468B1

United States Patent
Li

(10) Patent No.: US 10,027,468 B1
(45) Date of Patent: Jul. 17, 2018

(54) ETHERNET PHYSICAL LAYER CIRCUIT AND CLOCK RECOVERY METHOD THEREOF

(71) Applicant: ALi Corporation, Hsinchu (TW)

(72) Inventor: Rong-yun Li, Shanghai (CN)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 15/687,195

(22) Filed: Aug. 25, 2017

(30) Foreign Application Priority Data

May 9, 2017 (CN) .......................... 2017 1 0321333

(51) Int. Cl.
| H04L 7/033 | (2006.01) |
| H04L 7/00 | (2006.01) |
| H03L 7/06 | (2006.01) |
| H04L 7/02 | (2006.01) |

(52) U.S. Cl.
CPC .............. *H04L 7/0016* (2013.01); *H03L 7/06* (2013.01); *H04L 7/02* (2013.01)

(58) Field of Classification Search
CPC ...... H04L 7/033; H04L 7/0331; H04L 7/0337
USPC ......................................................... 375/355
See application file for complete search history.

(56) References Cited

U.S. PATENT DOCUMENTS

| 6,101,230 | A | * | 8/2000 | Chun | .................. | H04L 27/2657 375/355 |
| 8,864,578 | B2 | * | 10/2014 | Bennett | ............... | G07F 17/3241 463/17 |
| 2007/0092260 | A1 | * | 4/2007 | Bontu | ................... | H04J 3/0608 398/152 |
| 2009/0282277 | A1 | * | 11/2009 | Sedarat | ................. | G06F 1/3209 713/320 |
| 2011/0202781 | A1 | * | 8/2011 | Wang | .................... | G06F 1/3203 713/323 |
| 2012/0170637 | A1 | * | 7/2012 | Huang | .............. | H04L 25/03057 375/231 |
| 2013/0054995 | A1 | * | 2/2013 | Dove | ................ | H04L 12/40032 713/323 |
| 2014/0064422 | A1 | * | 3/2014 | Zhang | .................. | H04L 7/0083 375/371 |

* cited by examiner

*Primary Examiner* — Kevin Kim
(74) *Attorney, Agent, or Firm* — J.C. Patents

(57) ABSTRACT

An Ethernet physical layer circuit and a clock recovery method are provided. An analog-to-digital converter samples an analog input signal with a sampling clock to generate a digital input signal. A clock generator is coupled to the analog-to-digital converter, outputs the sampling clock to the analog-to-digital converter, and adjusts a phase of the sampling clock according to a phase control signal. The clock recovery circuit is coupled to the analog-to-digital converter and the clock generator, detects a timing error of the digital input signal at refresh stages in a lower energy consumption idle mode to obtain phase adjustment information, and generates the phase control signal based on the phase adjustment information at quiet stages in the low power idle mode. The clock generator correspondingly receives the phase control signal in the quiet stages to adjust the phase of the sampling clock.

17 Claims, 7 Drawing Sheets

ETHERNET PHYSICAL LAYER CIRCUIT AND CLOCK RECOVERY METHOD THEREOF

CROSS-REFERENCE TO RELATED APPLICATION

This application claims the priority benefit of China application serial no. 201710321333.8, filed on May 9, 2017. The entirety of the above-mentioned patent application is hereby incorporated by reference herein and made a part of this specification.

BACKGROUND OF THE INVENTION

1. Field of the Invention

The invention relates to a clock synchronization circuit, and particularly relates to an Ethernet physical layer circuit and a clock recovery method thereof.

2. Description of Related Art

As the Ethernet is easy to access and set up and has fast transmission speed, the equipment relating to the Ethernet is emerging prosperously. It is anticipated that, as the data transmission speed is faster and faster, the requirements on clock synchronization and clock precision between a transmitting terminal and a receiving terminal are much higher than before. To be specific, in an Ethernet physical layer (PHY), to ensure the accuracy of the data restored by a receiving circuit, a sampling clock at the transmitting terminal and a sampling clock at the receiving terminal should ideally be at the same frequency to ensure that the receiving end is able to accurately restore data transmitted by transmitting terminal. However, regardless of the transmitting terminal or the receiving terminal, local oscillation for generating the sampling clock may have frequency deviation. Therefore, the sampling clocks at the receiving terminal and the transmitting terminal may not be synchronous. Generally speaking, to synchronize the sampling clocks at the transmitting terminal and the receiving terminal, clock information needs to be retrieved from data signals received by the receiving end. Accordingly, the sampling clock at the receiving terminal may follow and be locked by the sampling clock of the transmitting terminal.

Also, as the growing awareness in energy efficiency, an energy saving solution that dynamically saves energy based on network traffic is proposed. In the energy saving solution, the Ethernet physical layer circuit may attempt to finish data transmission as soon as possible in an active mode, and enters a low power idle mode after data transmission is completed. The Ethernet physical layer circuit stops receiving and transmitting data in a quiet stage of the low power idle mode to reduce energy consumption. At a refresh stage in the low power idle mode, the Ethernet physical layer circuit receives and transmits an idle signal to keep a valid network linkage. However, as a duration of the refresh stage is very short, the sampling clock at the receiving end may fail to be locked according to the sampling clock of the transmitting terminal with the idle signal during the refresh stage. Accordingly, the synchronization between the sampling clocks of the receiving terminal and the transmitting terminal is gradually lost. Once the sampling clocks at the receiving terminal and the transmitting terminal are no longer synchronized, the network linkage between the receiving terminal and the transmitting terminal may be disconnected during the low power idle mode.

SUMMARY OF THE INVENTION

Accordingly, the invention provides an Ethernet physical layer circuit and a clock recovery method thereof capable of more accurately synchronizing sampling clocks at a receiving terminal and a transmitting terminal, thereby facilitating performance of the Ethernet physical layer.

An embodiment of the invention provides an Ethernet physical layer circuit, including an analog-to-digital converter, a clock generator, and a clock recovery circuit. The analog-to-digital converter samples an analog input signal by using a sampling clock to generate a digital input signal. The clock generator is coupled to the analog-to-digital converter, outputs the sampling clock to the analog-to-digital converter, and adjusts a phase of the sampling clock according to a phase control signal. The clock recovery circuit is coupled to the analog-to-digital converter and the clock generator, detects a timing error of the digital input signal at a plurality of refresh stages in a lower energy consumption idle mode to obtain phase adjustment information, and generates the phase control signal based on the phase adjustment information at a plurality of quiet stages in the low power idle mode. The clock generator adjusts the phase of the sampling clock in response to receiving the phase control signal in the quiet stages.

From another perspective, an embodiment of the invention provides a clock recovery method for an Ethernet physical layer circuit. The method includes steps as follows: entering a low power idle mode; sampling an analog input signal by using a sampling clock to generate a digital input signal at a plurality of refresh stages of the low power idle mode; detecting a timing error of the digital input signal to obtain phase adjustment information at the refresh stages of the low power idle mode; and generating a phase control signal based on the phase adjustment information at a plurality of quiet stages of the low power idle mode, wherein a clock generator adjusts a phase of the sampling clock in response to receiving the phase control signal at the quiet stages.

Based on the above, in the embodiments of the invention, the timing error of the digital input signal may be detected at the refresh stages to obtain the phase adjustment information, and the phase of the sampling clock is adjusted based on the phase adjustment information at the quiet stages. Accordingly, the frequency offset generated due to frequency jitter in the low power idle mode is able to be more properly compensated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
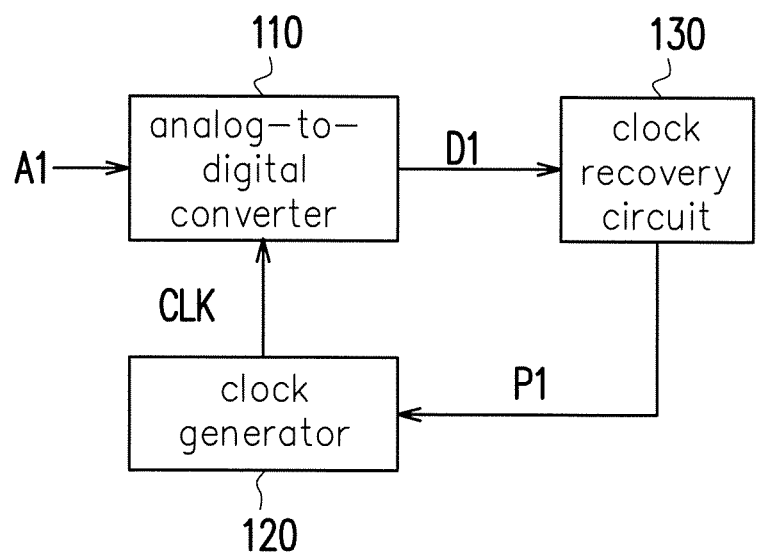
FIG. 1 is a schematic view illustrating an Ethernet physical layer circuit according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating an Ethernet physical layer circuit according to an embodiment of the invention. Referring to FIG. 1, an Ethernet physical layer circuit 10 is a physical connection interface configured to be connected to a network cable. In the embodiment, the Ethernet physical layer circuit 10 may be implemented to be an Ethernet network chip, and include an analog-to-digital converter 110, a clock generator 120, and a clock recovery circuit 130. However, while not shown in the drawings, people having ordinary skills in the art shall appreciate that the Ethernet physical layer circuit 10 may further include other circuit modules, such as a digital-to-analog converter, a decoding circuit, a delay removing circuit, and the like. The invention does not intend to impose a limitation on this regard.

In the embodiment, the analog-to-digital converter 110 generates a digital input signal D1 by sampling an analog input signal A1 with a sampling clock CLK. Specifically, the analog-to-digital converter 110 may receive the analog input signal A1 transmitted through a twisted pair cable via an Ethernet socket, the analog-to-digital converter 110 then performs analog-to-digital conversion on the analog input signal A1 and outputs a digital input signal D1.

The clock generator 120 is coupled to the analog-to-digital converter 110, outputs the sampling clock CLK to the analog-to-digital converter 110, and adjusts a phase of the sampling clock CLK according to a phase control signal P. In an embodiment, the clock generator 120 is a multi-phase clock generator, for example, is capable of advancing or retreating the phase of the sampling clock CLK output by the clock generator 120 in response to a pulse of the phase control signal P1.

The clock recovery circuit 130 is coupled to the analog-to-digital converter 110 and the clock generator 120, and receives the digital input signal D1. The clock recovery circuit 130 retrieves information relating to a sampling clock at a transmitting terminal from the digital input signal D1 and generates the phase control signal P1, so as to adjust the phase of the sampling clock CLK according to the phase control signal P1. In the embodiment, the clock recovery circuit 130 detects a timing error of the digital input signal D1 at a plurality of refresh stages of a low power idle mode to obtain phase adjustment information. Besides, the clock recovery circuit 130 generates the phase control signal P1 according to the phase adjustment information at a plurality of quiet stages of the low power idle mode. Accordingly, the clock generator 120 may adjust the phase of the sampling clock CLK in response to receiving the phase control signal P1 at the quiet stages. The Ethernet physical layer 10 stops transmitting and receiving data at the quiet stages, but the clock recovery circuit 130 may still adjust the phase of the sampling clock CLK output by the clock generator 120 at the quiet stages according to the phase adjustment information generated at the refresh stages, so as to compensate for frequency deviation occurring between the Ethernet transmitting terminal and Ethernet receiving terminal due to frequency jitter.

Figure 2:
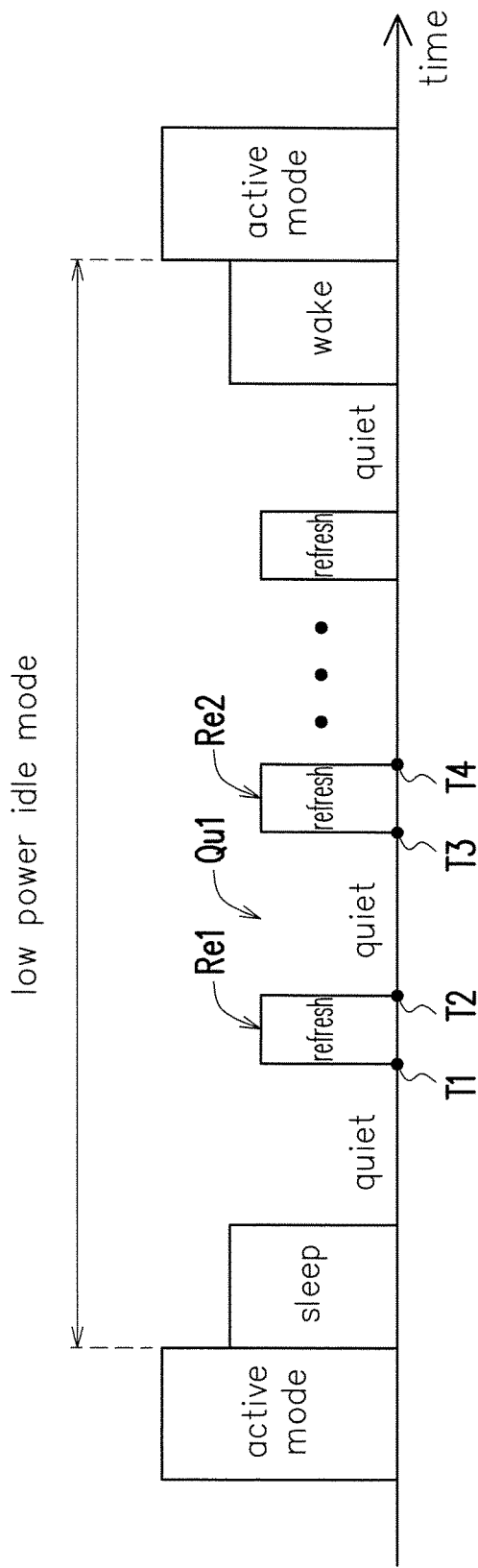
FIG. 2 is a schematic view illustrating a plurality of operation stages in an energy-efficient Ethernet standard.

FIG. 2 is a schematic view illustrating a plurality of operation stages in an energy-efficient Ethernet standard. Referring to FIG. 2, it is assumed that the Ethernet physical layer circuit 10 supports an energy-efficient Ethernet (EEE) standard, and the EEE standard is the IEEE 802.3az standard, for example. When supporting the EEE standard, the Ethernet physical layer circuit 10 may receive and transmit data in an active mode. When a media access (MAC) layer confirms that no data needs to be transmitted, the Ethernet physical layer circuit 10 may enter into the low power idle mode. In the low power idle mode of the EEE standard, the Ethernet physical layer circuit 10 is operated alternately between the refresh stages (e.g., refresh stages Re1 and Re2) and the quiet stages (e.g., quiet stage Qu1). In the respective quiet stages, the Ethernet physical layer circuit 10 stops transmitting and receiving data. In the respective refresh stages, the Ethernet physical layer circuit 10 receives an idle signal to keep a linkage active.

In the embodiment, when the Ethernet physical layer circuit 10 is operated at the refresh stage Re1 (from a time point T1 to a time point T2), the analog-to-digital converter 110 may covert an idle signal into the digital input signal D1, and the clock recovery circuit 130 may detect a timing error of the digital input signal D1 based on a timing error detection algorithm to generate the phase adjustment information. In other words, the analog input signal A1 is the idle signal at the refresh stage Re1. Then, when the Ethernet physical layer circuit 10 is operated at the quiet stage Qu1 (from the time point T2 to a time point T3), the clock recovery circuit 130 may generate the phase control signal P1 based on the current phase adjustment information. Accordingly, the clock generator 120 may adjust the phase of the sampling clock CLK in response to receiving the phase control signal P1 at the quiet stage Qu1. In the embodiment, when the Ethernet physical layer circuit 10 is operated at the refresh stage Re2 (from the time point T3 to a time point T4) again, the analog-to-digital converter 110 coverts the idle signal into the digital input signal D1, and the clock recovery circuit 130 may again detect the timing error of the digital input signal D based on the timing error detection algorithm and update the phase adjustment information or temporarily not update the phase adjustment information. The phase adjustment information generated at the refresh stage Re2 may be provided to allow the Ethernet physical layer circuit 10 to generate the phase control signal P1 when the Ethernet physical layer circuit 10 is operated at the next quiet stage (not shown). Subsequent operations may follow the same principle. The phase adjustment information is generated based on the timing error information within at least one refresh stage.

Figure 3:
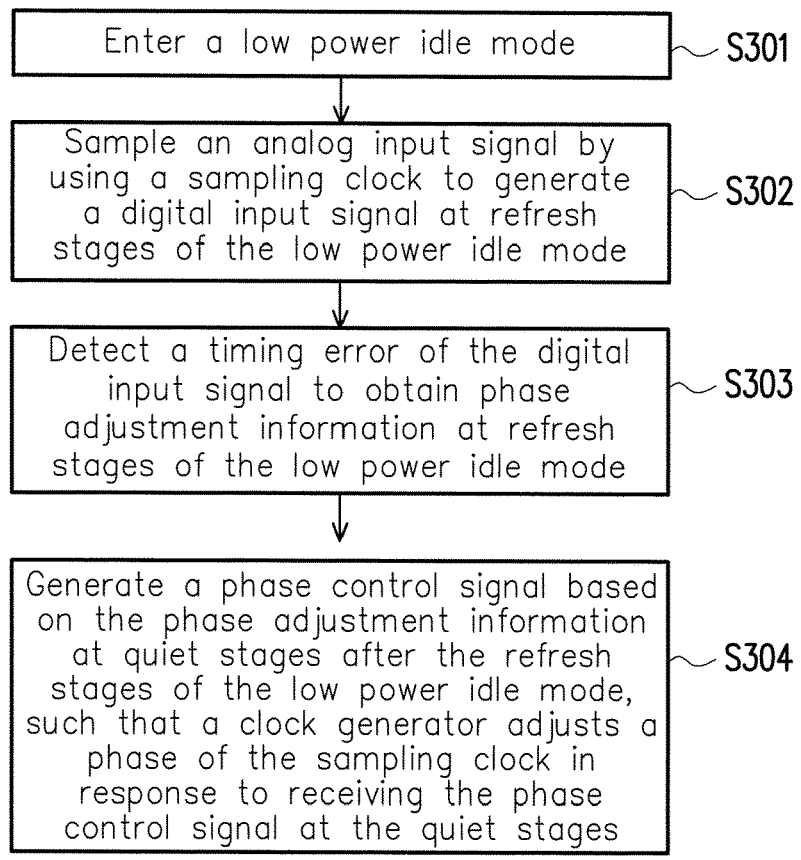
FIG. 3 is a flowchart illustrating a clock recovery method according to an embodiment of the invention.

FIG. 3 is a flowchart illustrating a clock recovery method according to an embodiment of the invention. In the embodiment, the clock recovery method is suitable for the Ethernet physical layer circuit 10 shown in FIG. 1. However, the invention is not limited thereto.

Referring to FIG. 3, at Step S301, the Ethernet physical layer circuit 10 enters the low power idle mode. At Step S302, at the refresh stage of the low power idle mode, the analog-to-digital converter 110 generates the digital input signal D by sampling the analog input signal A1 by using the sampling clock CLK. At Step S303, at the refresh stage of the low power idle mode, the clock recovery circuit 130 detects the timing error of the digital input signal D1 to obtain the phase adjustment information. At Step S304, at the quiet stage of the low power idle mode after the refresh stage, the clock recovery circuit 130 generates the phase control signal P1 based on the phase adjustment information. Accordingly, the clock generator 120 adjusts the phase of the sampling clock CLK in response to receiving the phase control signal P1 at the quiet stage. Steps S302 to S304 may be performed in order repeatedly according to the alternate refresh and quiet stages, until the Ethernet physical layer circuit 10 exits the low energy idle mode.

Figure 4:
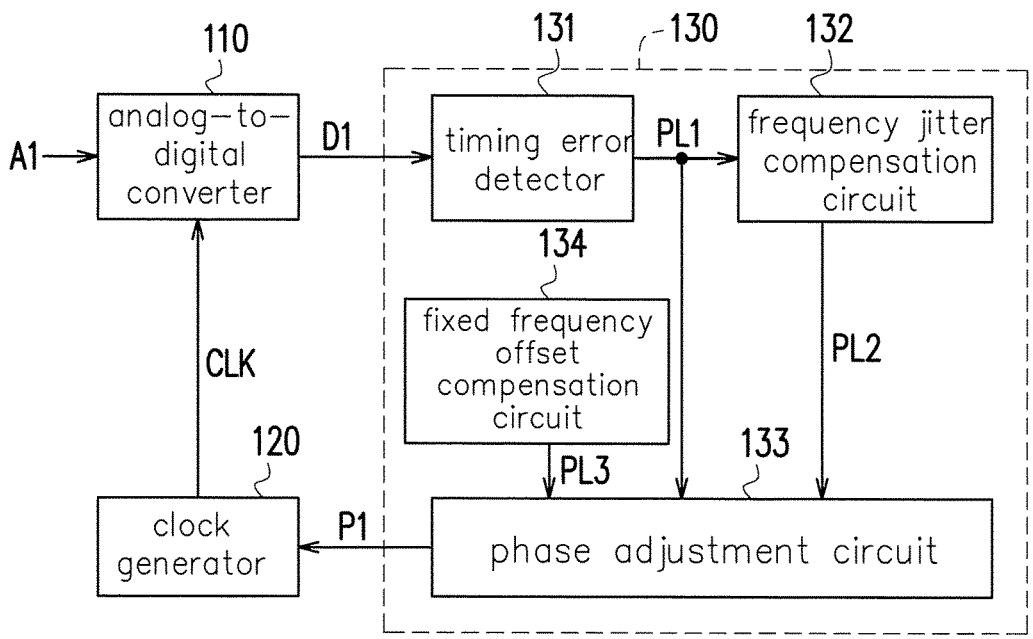
FIG. 4 is a schematic view illustrating an Ethernet physical layer circuit according to an embodiment of the invention.

FIG. 4 is a schematic view illustrating an Ethernet physical layer circuit according to an embodiment of the invention. Referring to FIG. 4, in the embodiment, the clock recovery circuit 130 includes a timing error detector (TED) 131, a frequency jitter compensation circuit 132, a phase adjustment circuit 133, and a fixed frequency offset compensation circuit 134.

The timing error detector 131 receives the digital input signal D1, and detects the timing error of the digital input signal D1 at the refresh stages to output a first pulse signal PL1. In brief, when the timing error detector 131 receives the digital input signal D1, the timing error detector 131 may detect a phase deviation of the digital input signal D1 by a variety of algorithms, so as to generate the first pulse signal PL1 indicating a phase difference between the sampling clock CLK and a working clock at the transmitting terminal transmitting the analog input signal A1. The first pulse signal PL1 includes at least one first advanced pulse, at least one first retreated pulse, or a combination thereof. For example, the timing error detector 131 may estimate the timing error of the digital input signal D1 based on the modified Mueller and Muller algorithm or the modified zero-forcing algorithm. The invention does not intend to impose a limitation on this regard.

The frequency jitter compensation circuit 132 receives the first pulse signal PL1 and determines the phase adjustment information according to the number of pulse of the first pulse signal PL1. The frequency jitter compensation circuit 132 generates a second pulse signal PL2 according to the phase adjustment information at the quiet stages. The second pulse signal PL2 includes at least one second advanced pulse or at least one second retreated pulse. Specifically, the frequency jitter compensation circuit 132 calculates the number of the first advanced pulse and the number of the first retreated pulse of the first pulse signal PL1 to obtain the phase adjustment information.

The phase adjustment circuit 133 is coupled to the timing error detector 131 and the frequency jitter compensation circuit 132, and generates the phase control signal P1 based on the second pulse signal PL2 at the quiet stages. In addition, the phase adjustment circuit 133 may generate the phase control signal P1 based on the first pulse signal PL1 at the refresh stages. The phase control signal P1 includes at least one phase-advanced pulse, at least one phase-retreated pulse, or a combination thereof. Specifically, at the refresh stages, the phase adjustment circuit 133 may correspondingly output the phase-advanced pulse of the phase control signal P1 in response to receiving the first advanced pulse of the first pulse signal PL1, and correspondingly output the phase-retreated pulse of the phase control signal P1 in response to receiving the first retreated pulse of the first pulse signal PL1. In addition, at the quiet stages, even though the timing error detector 131 does not output any pulse when no data is received, the frequency jitter compensation circuit 132 may generate the second pulse signal PL2 based on the phase adjustment information. Therefore, at the quiet stages, the phase adjustment circuit 133 may correspondingly output the phase-advanced pulse of the phase control signal P1 in response to receiving the second advanced pulse of the second pulse signal PL2, or correspondingly output the phase-retreated pulse of the phase control signal P1 in response to receiving the second retreated pulse of the second pulse signal PL2.

Furthermore, the fixed frequency offset compensation circuit 134 is coupled to the phase adjustment circuit 133. The fixed frequency offset compensation circuit 134 may obtain a fixed frequency offset which is estimated in the active mode of the energy-efficient Ethernet standard. In brief, when operating in the active mode, the analog-to-digital converter 110 receives the analog input signal A1 carrying data. In addition, the analog-to-digital converter 110 generates the digital input signal D1 by sampling the analog input signal A1 based on the sampling clock CLK. Therefore, through calculation for a longer period of time in the active mode, the fixed frequency offset between the sampling clock CLK and a sampling clock at the transmitting terminal of the analog input signal A1 is able to be estimated. It should be noted that, the fixed frequency offset in the active mode is not a fixed compensation amount, and is variable in response to continuous calculation and estimation in the active mode. Once the Ethernet physical layer circuit 10 is switched to operate in the low power idle mode, the fixed frequency offset is temporarily fixed until the next time when the Ethernet physical layer circuit 10 is operated in the next active mode. In the embodiment, the fixed frequency offset circuit 134 may generate a third pulse signal PL3 based on the fixed frequency offset in the low power idle mode. Accordingly, the phase adjustment circuit 133 generates the phase control signal P1 based on the third pulse signal PL3. The third pulse signal PL3 includes at least one third advanced pulse or at least one third retreated pulse, and the at least one third advanced pulse and the at least one third retreated pulse are periodical. In other words, generation of the pulse of the third pulse signal PL3 is not limited to the refresh stages or the quiet stages. The pulse of the third pulse signal PL3 is generated periodically based on the fixed frequency offset.

Figure 5:
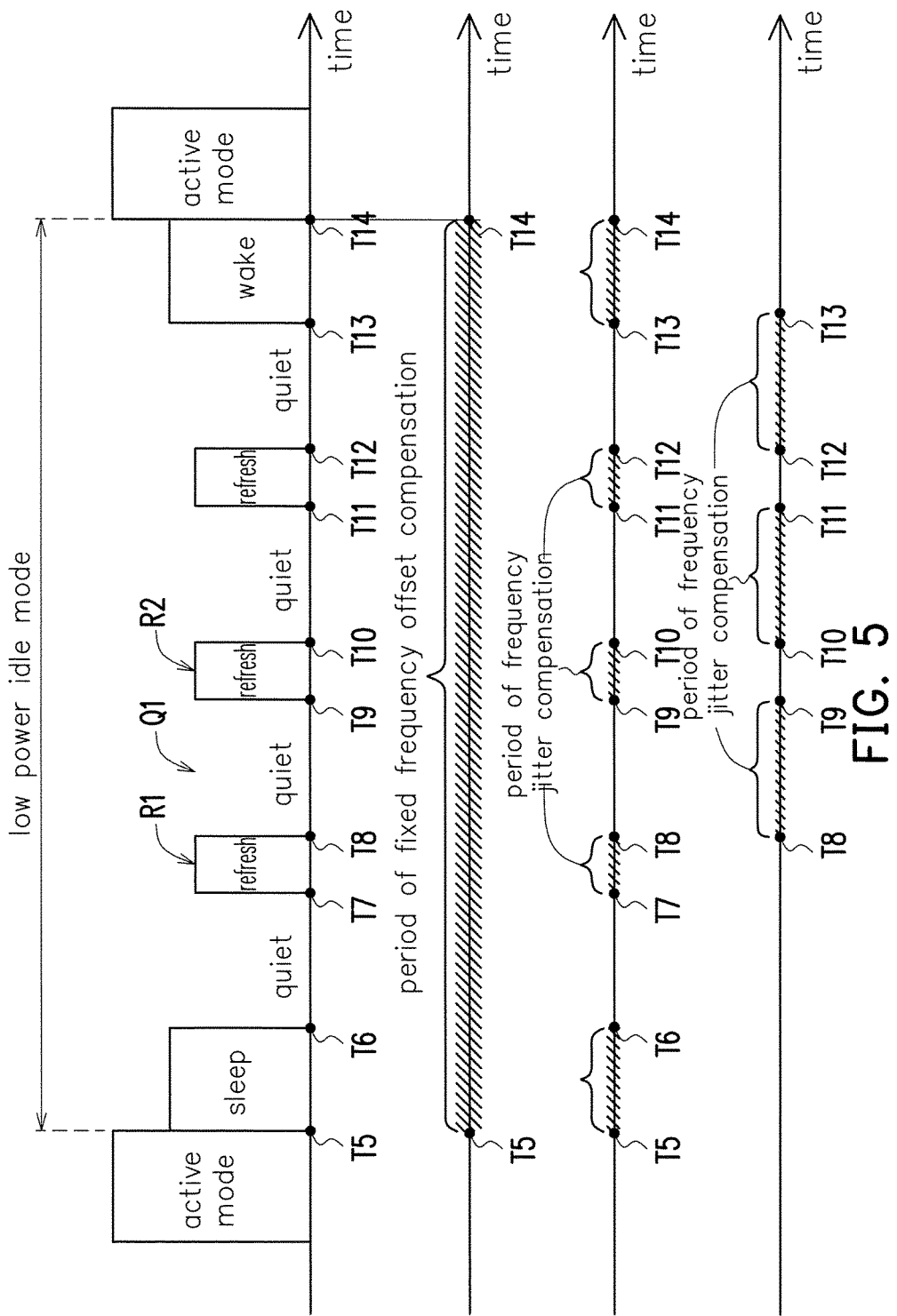
FIG. 5 is a schematic view illustrating timing of compensating for frequency deviation in a low power idle mode according to an embodiment of the invention.

FIG. 5 is a schematic view illustrating timing of compensating for frequency deviation in a low power idle mode according to an embodiment of the invention. Referring to FIG. 5, the low power idle mode includes alternate M refresh stages and (M+1) quiet stages, and it is assumed that M=3. When there is no data that needs to be transmitted between a transmitting apparatus and a receiving apparatus, the Ethernet physical layer circuit 10 may be operated in a short sleep stage to prepare for entering the quiet stage after entering the low power idle mode. In the embodiment, the Ethernet physical layer circuit 10 enters the low power idle mode at a time point T5, and is operated in the sleep stage until a time point T6. When there are data to be transmitted between the transmitting apparatuses and the receiving apparatuses, the Ethernet physical layer circuit 10 is operated in a wake stage to prepare for data transmission, and exits the low power idle mode and is switched back to the active mode at a time point T14. The Ethernet physical layer circuit 10 is operated at the quiet stages from the time point T6 to a time point T7, from a time point T8 to a time point T9, from a time point T10 to a time point T11, and from a time point T12 to a time point T13. The Ethernet physical layer circuit 10 is operated in the refresh stages from the time point T7 to the time point T8, from the time point T9 to the time point T10, and from the time point T11 to the time point T12.

Accordingly, during a period of fixed frequency offset compensation (i.e., from the time point T5 to the time point T14), the phase adjustment circuit 133 may periodically receive the pulse of the third pulse signal PL3, and trigger a pulse in the pulse control signal P1 in response to receiving the pulse of the third pulse signal PL3. In addition, during a period of frequency jitter compensation (i.e., from the time point T7 to the time point T8, from the time point T9 to the time point T10, and from the time point T11 to the time point T12), the phase adjustment circuit 133 may generate the phase control signal P1 based on the first advanced pulse and/or the first retreated pulse of the first pulse signal PL1 at the refresh stages. In other words, during the period of frequency jitter compensation (i.e., from the time point T7 to the time point T8, from the time point T9 to the time point T10, and from the time point T11 to the time point T12) corresponding to the refresh stages, the phase adjustment circuit 133 generates a pulse in the phase control signal P1 in response to receiving the pulse of the first pulse signal PL1, so as to adjust the phase of the sampling clock CLK based on a detection result of the timing error detector 131. It should also be noted that, during the period of frequency jitter compensation (from the time point T5 to the time point T6 and from the time point T13 to the time point T14), the timing error detector 131 may estimate a phase deviation based on reception of the analog input signal A1 at the sleep stage and the wake stage, so as to drive the phase adjustment circuit 133 to adjust the phase of the sampling clock CLK. In other words, the operation principles of the clock recovery circuit 130 at the sleep stage and the wake stage are similar to that at the refresh stage. Therefore, details in this regard will not be repeated in the following.

In addition, during the period of frequency jitter compensation (i.e., from the time point T8 to the time point T9, from the time point T10 to the time point T11, and from the time point T12 to the time point T13), the phase adjustment circuit 133 may generate the phase control signal P1 based on the second advanced pulse or the second retreated pulse of the second pulse signal PL2 at the quiet stages. In other words, in the frequency jitter compensation period corresponding to the quiet stages, the phase adjustment circuit 133 may trigger a pulse in the phase control signal P1 in response to receiving the pulse of the second pulse signal PL2, so as to adjust the phase of the sampling clock CLK based on a counting result of the frequency jitter compensation circuit 132 counting the first advanced pulse and/or the first retreated pulse. Compared with only compensating for frequency offset caused by frequency jitter at the refresh stages, the invention is able to increase the accuracy of clock tracking by compensating for frequency offset caused by frequency jitter at the quiet stages.

Moreover, in an embodiment, the frequency jitter compensation circuit 133 may generate the phase adjustment information with better accuracy by accumulating timing error detection information at the plurality of refresh stages, so as to avoid ineffective compensation for frequency deviation due to insufficient timing error detection information caused by an overly short period of time in a single refresh stage. In the following, details in this regard will be described.

Figure 6:
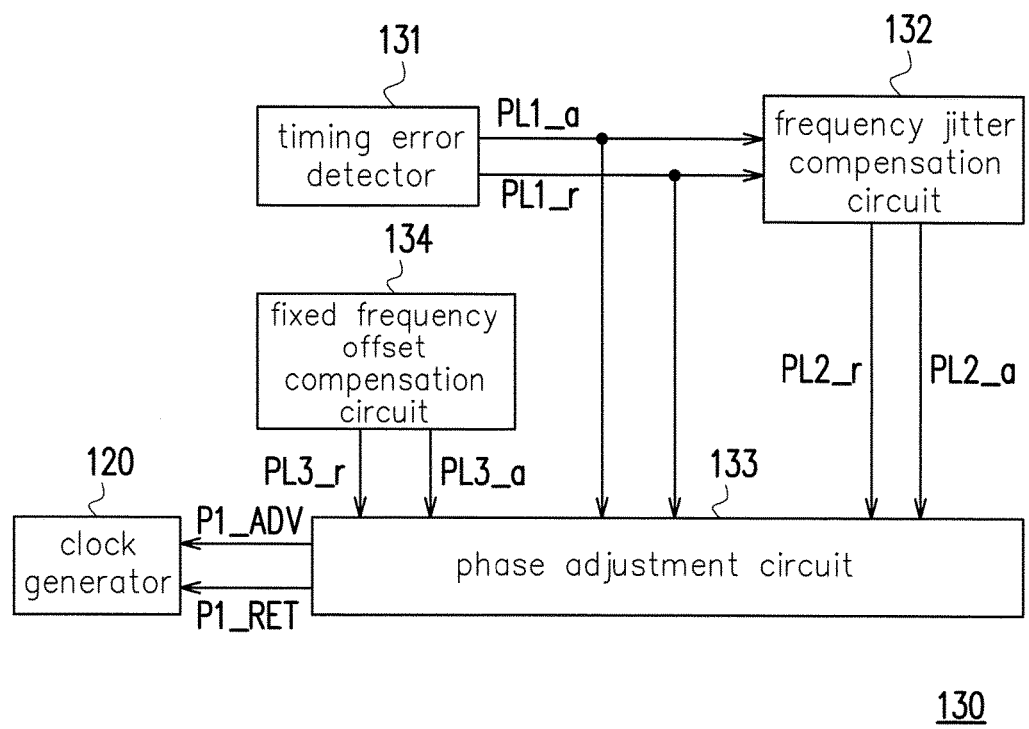
FIG. 6 is a schematic view illustrating a clock recovery circuit according to an embodiment of the invention.

FIG. 6 is a schematic view illustrating a clock recovery circuit according to an embodiment of the invention. In the embodiment, the low power idle mode includes M refresh stages and (M+1) quiet stages that are operated alternately. It should be noted that, referring to FIG. 6, in the embodiment, the first pulse signal PL1 may include a first advanced pulse signal PL1_a and a first retreated pulse signal PL1_r. The second pulse signal PL2 may include a second advanced pulse signal PL2_a and a second retreated pulse signal PL2_r. The third pulse signal PL3 may include a third advanced pulse signal PL3_a and a third retreated pulse signal PL3_r. The phase control signal P1 includes a phase-advanced signal P1_ADV and a phase-retreated signal P1_RET. In an embodiment, the clock generator 120 controls the sampling signal CLK to advance one or more phases in response to the phase-advanced signal P1_ADV, or retreat one or more phases in response to the phase-retreated signal P1_RET.

In the embodiment, the frequency jitter compensation circuit 132 accumulates the number of times of experiencing the refresh stage in response to the Ethernet physical layer circuit 10 entering the low power idle mode. The frequency jitter compensation circuit 132 determines whether the number of times of experiencing the refresh stage is equal to a target number. The target number is P, P is a multiple of n, and n is an integer greater than 1. Herein, n may be considered as a statistic unit. The frequency jitter compensation circuit 132 calculates a difference between the number of a first advanced pulse and the number of a first retreated pulse within the $i^{th}$ refresh stage to obtain single-level adjustment information at the $i^{th}$ refresh stage, and i refers to the number of experiencing times and is an integer less than or equal to M. More specifically, the frequency jitter compensation circuit 132 may count the number of the first advanced pulse of the first pulse-advanced signal PL1_a in each refresh stage, and count the number of the first retreated pulse of the first pulse-retreated signal PL1_r in each refresh stage. The frequency jitter compensation circuit 132 calculates the difference between the number of the first advanced pulse and the number of the first retreated pulse in each refresh stage, and adopts the difference as the single-level adjustment information of each refresh stage. The single-level adjustment information includes the number of pulse and a phase adjustment direction, such as "one advanced pulse", "two retreated pulses", or the like.

After the Ethernet physical layer circuit 10 enters the low power idle mode, when the number of times i of experiencing the refresh stage is equal to the target number P, the frequency jitter compensation circuit 132 may calculate the single-level adjustment information of the $(i-n+1)^{th}$ refresh stage to the single-level adjustment information of the $i^{th}$ refresh stage to obtain cycle information, and determine the phase adjustment information based on the cycle information at the $i^{th}$ refresh stage, wherein P is less than or equal to M. The cycle information includes the number of pulse and the phase adjustment direction. It should be noted that the frequency jitter compensation circuit 132 generates the cycle information every n refresh stages, and updates the phase adjustment information based on the cycle information every n refresh stages. In other words, the single-level adjustment information generated in the recent n refresh stages is calculated to serve as the phase adjustment information, so as to more effectively compensate for the frequency deviation at the quiet stages.

More specifically, the frequency jitter compensation circuit 132 may further calculate the single-level adjustment information of the $(i-2n+1)^{th}$ refresh stage to the single-level adjustment information of the $(i-n)^{th}$ refresh stage to obtain another cycle information. After experiencing the $(i-n+1)^{th}$ refresh stage to the $i^{th}$ refresh stage, the frequency jitter compensation circuit 132 may determine the current phase adjustment information at the $i^{th}$ refresh stage based on the cycle information at the $i^{th}$ refresh stage and the another cycle information at the $(i-n)^{th}$ refresh stage.

Accordingly, after experiencing the $(i-n+1)^{th}$ refresh stage to the $i^{th}$ refresh stage, the frequency jitter compensation circuit 132 may generate the second pulse signal PL2 at the $(i+1)^{th}$ quiet stage based on the current phase adjustment information determined according to the cycle information calculated at the $i^{th}$ refresh stage and the previous cycle information calculated at the $(i-n)^{th}$ refresh stage. In another embodiment, the frequency jitter compensation circuit 132 may determine the current phase adjustment information based on all the cycle information calculated so far. For example, when P is greater than three times of n (i.e., when the frequency jitter compensation circuit 132 obtains three or more cycle information), the frequency jitter compensation circuit 132 may determine the current phase adjustment information based on the three or more cycle information calculated so far.

Figure 7:
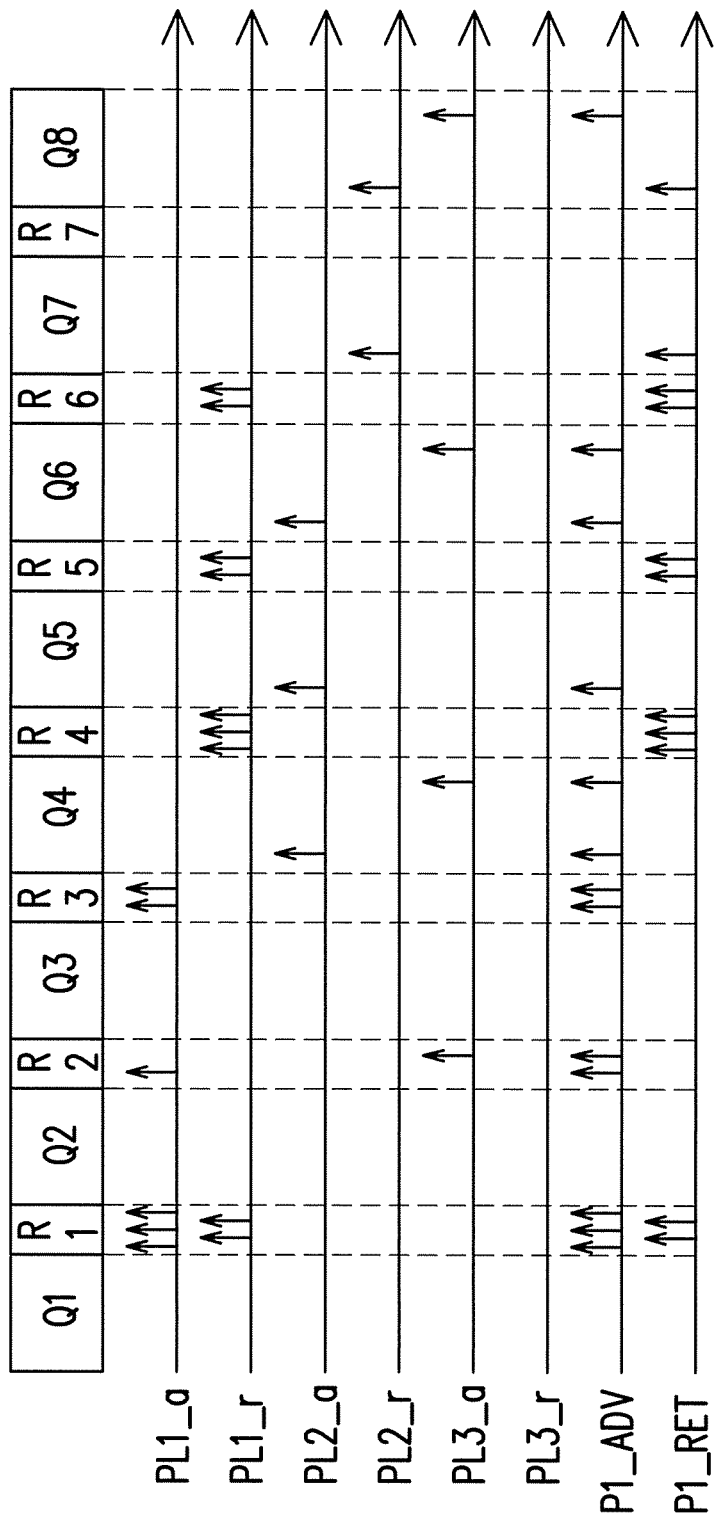
FIG. 7 is a schematic view illustrating a timing of a signal of a clock recovery circuit according to an embodiment of the invention.

For example, FIG. 7 is a schematic view illustrating a timing of a signal of a clock recovery circuit according to an embodiment of the invention. Referring to FIGS. 6 and 7, the low power idle mode includes M refresh stages and (M+1) quiet stages, and the frequency jitter compensation circuit 132 updates the phase adjustment information every n refresh stages. In the embodiment, it is assumed M=7 and that the frequency jitter compensation circuit 132 updates the phase adjustment information every three refresh stages (i.e., n=3). However, the invention is not limited thereto. In other embodiments, the frequency jitter compensation circuit 132 may update the phase adjustment information every four or five refresh stages. In other words, in the example shown in FIG. 7, the frequency jitter compensation circuit 132 sets three refresh stages as a unit of calculation.

In the example of FIG. 7, in a first refresh stage R1, the first pulse-advanced signal PL1_a output by the timing error detector 131 includes three first advanced pulses, and the first pulse-retreated signal PL1_r output by the timing error detector 131 includes two first retreated pulses. Therefore, the phase adjustment circuit 133 may output the phase-advanced signal P1_ADV including three phase-advanced pulses in response to the first pulse-advanced signal PL1_a, and the phase adjustment circuit 133 may output the phase-retreated signal P1_RET including two phase-retreated pulses in response to the first pulse-retreated signal PL1_r. Accordingly, the clock generator 120 may adjust the phase of the clock signal CLK for multiple times according to the phase-advanced signal P_ADV and the phase-retreated signal P1_RET. In addition, in the first refresh stage R1, since the first pulse-advanced signal PL1_a includes three first advanced pulses and the first pulse-retreated pulse signal PL1_r includes two first retreated pulses, the single-level adjustment information obtained by the frequency jitter compensation circuit 132 is "one advanced pulse".

Then, in a second quiet stage Q2, since the number of times of experiencing the refresh stage is not enough to contribute a statistic unit, the frequency jitter compensation circuit 132 does not generate the phase adjustment information. Accordingly, at the second quiet stage Q2, the second pulse-advanced signal PL2_a and the second pulse-retreated signal PL2_r do not include any pulse and are substantially maintained at a fixed potential.

At the second refresh stage R2, only the first pulse-advanced signal PL1_a includes one first advanced pulse and the first pulse-retreated signal PL1_r is substantially maintained at a fixed potential. Therefore, the single-level adjustment information obtained by the frequency jitter compensation circuit 132 at the second refresh stage R2 is "one advanced pulse". Besides, based on the fixed frequency offset estimated in the active mode, the fixed frequency offset compensation circuit 132 outputs the third pulse-advanced signal PL3_a including one third advanced pulse at the second refresh stage R2. Thus, the phase adjustment circuit 133 may output the phase-advanced signal P1_ADV including two advanced pulses in response to the first pulse-advanced signal PL1_a and the third pulse-advanced signal PL3_a. Accordingly, the sampling clock CLK is adjusted to advance two phases at the refresh stage R2.

Then, in a third quiet stage Q3, similar to the operation at the second quiet stage Q2, no pulse is generated and the signals are substantially maintained at a fixed potential. In addition, the sampling clock CLK does not undergo any phase adjustment at the stage.

At a third refresh stage R3, the first pulse-advanced signal PL1_a includes two first advanced pulses, and the first pulse-retreated signal PL1_r does not include any first retreated pulse and is substantially maintained at a fixed potential. Since only the first pulse-advanced signal PL1_a includes two first advanced pulses, the single-level adjustment information obtained by the frequency jitter compensation circuit 132 at the third refresh stage R3 is "two advanced pulses". Thus, the phase adjustment circuit 133 may output the phase-advanced signal P1_ADV including two advanced pulses in response to the first pulse-advanced signal PL1_a. Accordingly, the sampling clock CLK is adjusted to advance two phases.

It should be noted that, at the third refresh stage R3, since the number of times of experiencing the refresh stage is equal to the target number (i.e., a multiple of 3), the frequency jitter compensation circuit 132 may calculate the single-level adjustment information from the first to third refresh stages, which are respectively "one advanced pulse", "one advanced pulse", and "two advanced pulses", and determine at the third refresh stage R3 that the cycle information is "one advanced pulse". Specifically, the frequency jitter compensation circuit 132 may average the single-level adjustment information of the first refresh stage to the single-level adjustment information of the third refresh stage, and generate the cycle information based on a result of dividing the accumulated number of pulses "4" by 3. Since the frequency jitter compensation circuit 132 does not receive other cycle information yet, the frequency jitter compensation circuit 132 may adopt the cycle information as the phase adjustment information at the third refresh stage R3.

Then, at a fourth quiet stage Q4, since the phase adjustment information is "one advanced pulse", the frequency jitter compensation circuit 132 may output the second pulse-advanced signal PL2_a including one second advanced pulse based on the phase adjustment information. Besides, based on the fixed frequency offset estimated in the active mode, the fixed frequency offset compensation circuit 132 outputs the third pulse-advanced signal PL3_a including one third advanced pulse at the fourth quiet stage Q4. Thus, the phase adjustment circuit 133 may output the phase-advanced signal P1_ADV including two advanced pulses in response to the second pulse-advanced signal PL2_a and the third pulse-advanced signal PL3_a. Accordingly, the sampling clock CLK is adjusted to advance two phases at the stage.

Then, at a fourth refresh stage R4, the first pulse-advanced signal PL1_a is substantially maintained at a fixed potential, and the first pulse-retreated signal PL1_r includes three first retreated pulses. Since the first pulse-retreated signal PL1_r includes three first retreated pulses, the single-level adjustment information obtained by the frequency jitter compensation circuit 132 at the fourth refresh stage R4 is "three retreated pulses". The phase adjustment circuit 133 may output the phase-retreated signal P1_RET including three retreated pulses in response to the first pulse-retreated signal PL1_r. Accordingly, the sampling clock CLK is adjusted to retreat three phases.

Then, at the fifth quiet stage Q5, since the number of times of experiencing the refresh stage is not equal to the target number (i.e., a multiple of 3), the frequency jitter compensation circuit 132 may output the second pulse-advanced signal PL2_a including one second advanced pulse based on the current phase adjustment information.

Then, operations at a fifth refresh stage R5, a sixth quiet stage Q6, and a sixth refresh stage R6 may be referred to the foregoing and will not be reiterated in the following. It should be noted that the single-level adjustment information obtained by the frequency jitter compensation circuit 132 at the fifth refresh stage R5 is "two retreated pulses". The single-level adjustment information obtained by the frequency jitter compensation circuit 132 at the sixth refresh stage R6 is also "two retreated pulses". Therefore, at the sixth refresh stage R6, since the number of times of experiencing the refresh stage is equal to the target number (i.e., a multiple of 3), the frequency jitter compensation circuit 132 may count the single-level adjustment information of the fourth refresh stage R4 to the single-level adjustment information of the sixth refresh stage R6, which are respectively "three retreated pulses", "two retreated pulses", and "two retreated pulses", and determine at the sixth refresh stage R6 that the cycle information is "two retreated pulses". Specifically, the cycle information at the sixth refresh stage R6 is generated based on a result of dividing the accumulated number of pulses "7" by 3. Accordingly, after experiencing the first refresh stage R1 to the sixth refresh stage R6, the frequency jitter compensation circuit 132 may determine the current phase adjustment information at the sixth refresh stage R6 based on the cycle information at the sixth refresh stage R6 and the cycle information at the third refresh stage R3. Since the cycle information at the sixth refresh stage R6 is "two retreated pulses", and the cycle information at the third refresh stage R3 is "one advanced pulse", by deducting the cycle information from one another, the frequency jitter compensation circuit 132 determines that the current phase adjustment information is "one retreated pulse".

Then, at a seventh quiet stage Q7 and an eighth quiet stage Q8, since the current phase adjustment information is "one retreated pulse", the frequency jitter compensation circuit 132 outputs the second pulse-retreated signal PL2_r including one second retreated pulse based on the current phase adjustment information.

It should be noted that, in the example of FIG. 7, at the seventh refresh stage R7, the first pulse-retreated signal PL1_r output by the timing error detector 131 may not include any pulse and be substantially maintained at a fixed potential. In addition, the first pulse-advanced signal PL1_a output by the timing error detector 131 may not include any pulse, either, and be substantially maintained at a fixed potential. Therefore, the single-level adjustment information obtained by the frequency jitter compensation circuit 132 at the seventh stage R7 is "zero adjustment pulse". Additionally, the third pulse-advanced signal PL3_a and the third pulse-retreated signal PL3_r output by the fixed frequency offset compensation circuit 134 at the seventh refresh stage R7 do not include any pulse, either. Thus, the phase of the sampling clock CLK output by the clock generator 120 at the seventh refresh stage R7 is not adjusted.

Based on the above, the example shown in FIG. 7 completes the fixed frequency offset compensation and frequency jitter compensation in the low power idle mode after the eighth quiet stage Q8. In other similar embodiments, such as an embodiment having a plurality of refresh stages and quiet stages operated alternately after the eighth quiet stage Q8, when operated at a ninth refresh stage, the frequency jitter compensation circuit 132 may average the single-level adjustment information from the seventh to ninth refresh stages, generate the cycle information at the ninth refresh stage, and update the phase adjustment information again based on the cycle information at the sixth refresh stage R6 and the cycle information at the ninth refresh stage. Accordingly, corresponding pulse signals may be generated at subsequent tenth to twelfth quiet stages. It should be noted that, when the frequency jitter compensation circuit 132 calculates the single-level adjustment information from the seventh to ninth refresh stages, the single-level adjustment information (i.e., "zero adjustment pulse") at the seventh refresh stage R7 is also considered in the generation of the cycle information at the ninth refresh stage.

Figure 8:
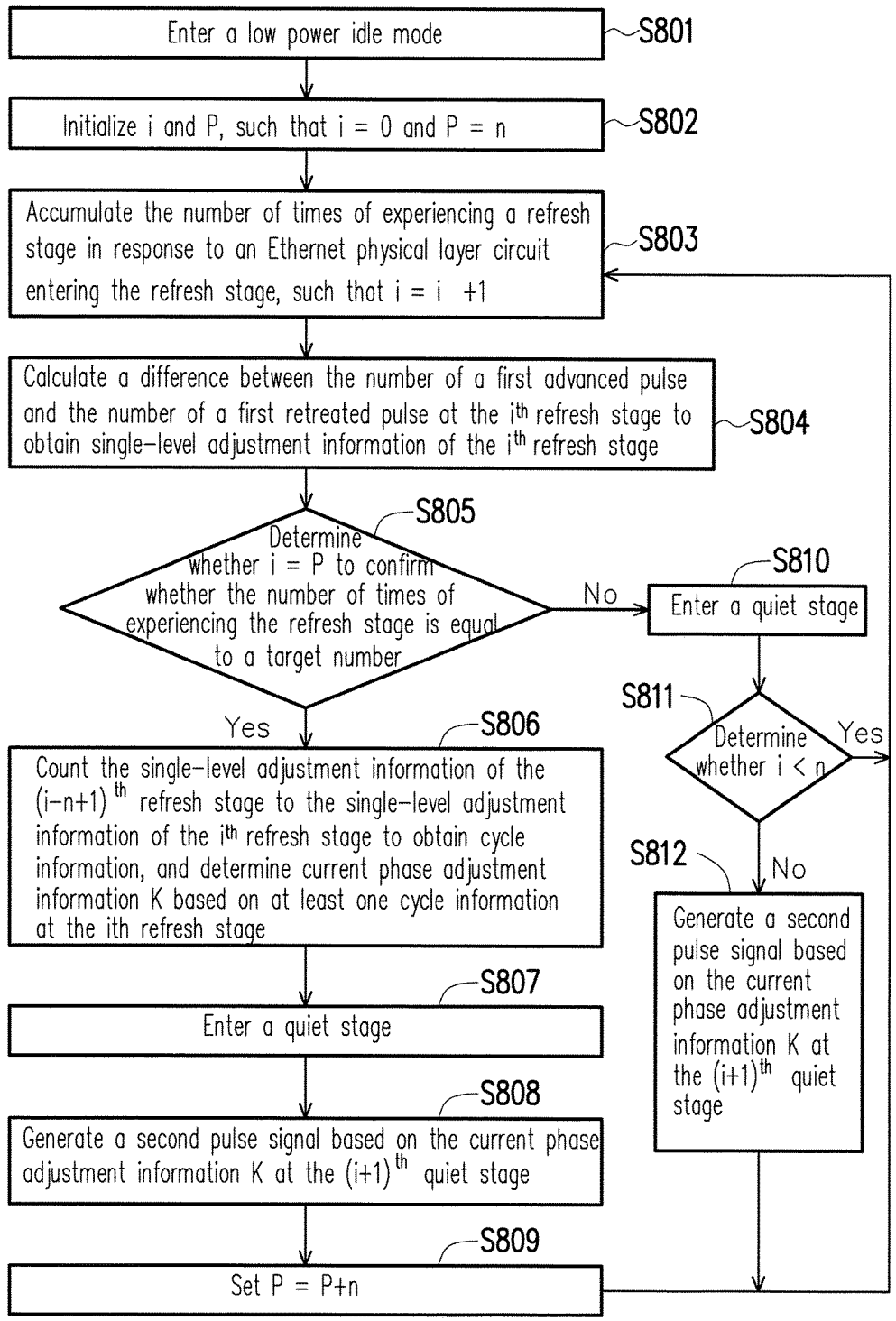
FIG. 8 is a flowchart illustrating a clock recovery method according to an embodiment of the invention.

FIG. 8 is a flowchart illustrating a clock recovery method according to an embodiment of the invention. It should be noted that, FIG. 8 serves to describe the phase compensation performed at the quiet stages based on the phase adjustment information calculated at the refresh stages, and the process in FIG. 8 neither includes the phase compensation performed based on the fixed frequency offset, nor includes the phase compensation performed at the refresh stages. In addition, sufficient teaching, suggestions and embodying details of the clock recovery method and relevant device features of the embodiment can be referred to the descriptions of the respective embodiments of FIGS. 1 to 7. Therefore, details will not be repeated in the following.

It should be noted that, in the embodiment of FIG. 8, i is the number of times of experiencing the refresh stage, and P is the target number, and n is the statistic unit. At Step S801, entering the low power idle mode. At Step S802, i and P are initialized to set i=0 and P=n. At Step S803, the number of times of experiencing the refresh stage is accumulated in response to the Ethernet physical layer circuit entering the refresh stage, so that i=i+1. At Step S804, the difference between the number of the first advanced pulse and the number of the first retreated pulse within the $i^{th}$ refresh stage is calculated to obtain the single-level adjustment information of the $i^{th}$ refresh stage. At Step S805, whether i is equal to P is determined to confirm whether the number of times of experiencing the refresh stage is equal to the target number.

If it is determined that the number of times of experiencing the refresh stage is equal to the target number at Step S805, the single-level adjustment information of the $(i-n+1)^{th}$ refresh stage to the single-level adjustment information of the $i^{th}$ refresh stage are counted at Step S806 to obtain the cycle information and determine current phase adjustment information K at the $i^{th}$ stage based on at least one cycle information. In an embodiment, at Step S806, when i is equal to P and P is equal to n, the phase adjustment information K determined at the $i^{th}$ refresh stage is equal to the cycle information generated at the $i^{th}$ refresh stage. When $i^{th}$ is equal to P and P is equal to two or more times of n, the phase adjustment information K determined at the $i^{th}$ refresh stage may be determined based on the cycle information generated at the $i^{th}$ refresh stage and the cycle information generated at the $(i-n)^{th}$ refresh stage. In other words, the phase adjustment information K determined each time may be determined based on the latest cycle information and the previous cycle information. At Step S807, entering the quiet stage. At Step S808, the second pulse signal is generated at the $(i+1)^{th}$ quiet stage based on the phase adjustment information K determined at the $i^{th}$ refresh stage. At Step S809, it is set that P=P+n, and Step S803 is performed again after Step S809 is performed.

If it is determined that the number of times of experiencing the refresh stage is not equal to the target number at Step S805, Step S810 is performed to enter the quiet stage. At Step S811, whether i is less than n is determined. If it is determined that i is less than n at Step S811, Step S803 is performed. If it is determined that i is not less than n at Step S811, the second pulse signal is generated at the $(i+1)^{th}$ quiet stage based on the current phase adjustment information K at Step S812, and Step S803 is performed again after Step S809 is performed.

According to the process shown in FIG. 8, when the number of times of experiencing the refresh stage reaches the target number, i.e., i=P, the latest phase adjustment information K is generated at the $i^{th}$ refresh stage, and the phase adjustment information K is supplied so as to generate the second pulse signal at each of the n quiet stages following the $i^{th}$ refresh stage. In other words, after the phase adjustment information K is updated at the $i^{th}$ refresh stage, in the case of the $i^{th}$ refresh stage generating the phase adjustment information K, the second pulse signal may be generated based on the same phase adjustment information K in the subsequent $(i+1)^{th}$ to $(i+n)^{th}$ quiet stages.

In view of the foregoing, in an embodiment of the invention, the timing error of the digital input signal may be detected at the refresh stages to obtain the phase adjustment information, and the phase of the sampling clock is adjusted based on the phase adjustment information at the quiet stages. In addition, by calculating the single-level adjustment information at the plurality of refresh stages, the frequency deviation is able to be estimated more accurately in the embodiments of the invention. Moreover, in the embodiments of the invention, by adjusting the phase of the sampling clock at the quiet stage based on the phase adjustment information, the phase deviation is kept within a predetermined range after each quiet stage. Accordingly, the speed that the Ethernet physical layer circuit synchronizes the sampling clocks in the refresh stages or the active mode is further facilitated. Furthermore, the frequency deviation generated due to frequency jitter in the low power idle mode is more properly compensated, so as to prevent the linkage between the transmitting end and the receiving end in the Ethernet from being disconnected due to unsynchronized clocks in the low power idle mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An Ethernet physical layer circuit, comprising:
   an analog-to-digital converter, sampling an analog input signal by using a sampling clock to generate a digital input signal;
   a clock generator, coupled to the analog-to-digital converter, outputting the sampling clock to the analog-to-digital converter, and adjusting a phase of the sampling clock according to a phase control signal; and
   a clock recovery circuit, coupled to the analog-to-digital converter and the clock generator, detecting a timing error of the digital input signal at a plurality of refresh stages of a low power idle mode to obtain phase adjustment information, and generating the phase control signal based on the phase adjustment information at a plurality of quiet stages of the low power idle mode, such that the clock generator adjusts the phase of the sampling clock in response to receiving the phase control signal in the quiet stages.

2. The Ethernet physical layer circuit as claimed in claim 1, wherein the Ethernet physical layer circuit supports an energy-efficient Ethernet standard, the Ethernet physical layer circuit is alternately operated between the refresh stages and the quiet stages in the low power idle mode of the energy-efficient Ethernet standard, and the analog input signal is an idle signal in the refresh stages.

3. The Ethernet physical layer circuit as claimed in claim 1, wherein the clock recovery circuit comprises:
   a timing error detector, receiving the digital input signal, and detecting the timing error of the digital input signal at the refresh stages to output a first pulse signal;
   a frequency jitter compensation circuit, receiving the first pulse signal, determining the phase adjustment information based on the number of pulse of the first pulse signal, and generating a second pulse signal based on the phase adjustment information at the quiet stages; and
   a phase adjustment circuit, coupled to the timing error detector and the frequency jitter compensation circuit, and generating the phase control signal based on the second pulse signal,
   wherein the first pulse signal comprises a first advanced pulse, a first retreated pulse, or a combination thereof, and the second pulse signal comprises a second advanced pulse or a second retreated pulse.

4. The Ethernet physical layer circuit as claimed in claim 3, wherein the clock recovery circuit further comprises:
   a fixed frequency offset compensation circuit, coupled to the phase adjustment circuit, obtaining a fixed frequency offset, and generating a third pulse signal based on the fixed frequency offset in the low power idle mode, such that the phase adjustment circuit generates the phase control signal based on the third pulse signal, wherein the third pulse signal comprises a third advanced pulse or a third retreated pulse, and the third advanced pulse and the third retreated pulse are periodical.

5. The Ethernet physical layer circuit as claimed in claim 3, wherein the phase adjustment circuit generates the phase control signal based on the first pulse signal at the refresh stages.

6. The Ethernet physical layer circuit as claimed in claim 5, wherein the phase adjustment circuit generates the phase control signal based on the first advanced pulse, the first retreated pulse, or the combination thereof at the refresh stages, and the phase adjustment circuit generates the phase control signal based on the second advanced pulse or the second retreated pulse at the quiet stages, wherein the phase control signal comprises a phase-advanced pulse, a phase-retreated pulse, or a combination thereof.

7. The Ethernet physical layer circuit as claimed in claim 3, wherein the frequency jitter compensation circuit accumulates the number of times of experiencing the refresh stage in response to the Ethernet physical layer entering the low power idle mode, and determines whether the number of times of experiencing the refresh stage is equal to a target number, wherein the target number is equal to P and is a multiple of n, and n is an integer greater than 1, the frequency jitter compensation circuit calculates a difference between the number of the first advanced pulse and the number of the first retreated pulse to obtain single-level adjustment information of the $i^{th}$ refresh stage, wherein i is the number of times of experiencing the refresh stage and is an integer, and when the number of times of experiencing the refresh stage is equal to the target number, the frequency jitter compensation circuit counts the single-level adjustment information of the $(i-n+1)^{th}$ refresh stage to the single-level adjustment information of the $i^{th}$ refresh stage to obtain cycle information, and determines the phase adjustment information based on the cycle information at the $i^{th}$ refresh stage.

8. The Ethernet physical layer circuit as claimed in claim 7, wherein the frequency jitter compensation circuit further counts the single-level adjustment information of the $(i-2n+1)^{th}$ refresh stage to the single-level adjustment information of the $(i-n)^{th}$ refresh stage to obtain another cycle information, and the frequency jitter compensation circuit determines the phase adjustment information based on the cycle information and the another cycle information at the $i^{th}$ refresh stage.

9. The Ethernet physical layer circuit as claimed in claim 8, wherein from the $(i+1)^{th}$ quiet stage to the $(i+n)^{th}$ quiet stage, the frequency jitter compensation circuit generates the second pulse signal based on the phase adjustment information determined at the $i^{th}$ refresh stage.

10. A clock recovery method for an Ethernet physical layer circuit, comprising:
    entering a low power idle mode;
    sampling an analog input signal by using a sampling clock to generate a digital input signal at a plurality of refresh stages of the low power idle mode;
    detecting a timing error of the digital input signal to obtain phase adjustment information at the refresh stages of the low power idle mode; and
    generating the phase control signal based on the phase adjustment information at a plurality of quiet stages of the low power idle mode, wherein a clock generator adjusts a phase of the sampling clock in response to receiving the phase control signal at the quiet stages.

11. The clock recovery method as claimed in claim 10, wherein the Ethernet physical layer circuit supports an energy-efficient Ethernet standard, the Ethernet physical layer circuit is alternately operated between the refresh stages and the quiet stages in the low power idle mode of the energy-efficient Ethernet standard, and the analog input signal is an idle signal in the refresh stages.

12. The clock recovery method as claimed in claim 10, wherein the step of detecting the timing error of the digital input signal to obtain the phase adjustment information at the refresh stages of the low power idle mode comprises:

detecting the timing error of the digital input signal at the refresh stages to output a first pulse signal comprising a first advanced pulse, a first retreated pulse, or a combination thereof;
determining the phase adjustment information based on the number of pulse of the first pulse signal within the refresh stages; and
generating the phase control signal based on the first pulse signal at the refresh stages.

13. The clock recovery method as claimed in claim 12, further comprising:
obtaining a fixed frequency offset, and generating a third pulse signal based on the fixed frequency offset in the low power idle mode, such that the phase adjustment circuit generates the phase control signal based on the third pulse signal, wherein the third pulse signal comprises a third advanced pulse or a third retreated pulse, and the third advanced pulse and the third retreated pulse are periodical.

14. The clock recovery method as claimed in claim 12, wherein the step of detecting the timing error of the digital input signal to obtain the phase adjustment information at the refresh stages of the low power idle mode further comprises:
accumulating the number of times of experiencing the refresh stage in response to the Ethernet physical layer circuit entering the low power idle mode; and
determining whether the number of times of experiencing the refresh stage is equal to a target number, wherein the target number is equal to P and is a multiple of n, and n is an integer greater than 1,
wherein the step of determining the phase adjustment information based on the number of pulse of the first pulse signal within the refresh stages comprises:
calculating a difference between the number of the first advanced pulse and the number of the first retreated pulse within the $i^{th}$ refresh stage to obtain single-level adjustment information of the $i^{th}$ refresh stage, wherein i is an integer, and
counting the single-level adjustment information of the $(i-n+1)^{th}$ refresh stage to the single-level adjustment information of the $i^{th}$ refresh stage to obtain cycle information and determining the phase adjustment information based on the cycle information at the $i^{th}$ refresh stage if the number of times of experiencing the refresh stage is equal to the target number.

15. The clock recovery method as claimed in claim 14, further comprising:
counting the single-level adjustment information of the $(i-2n+1)^{th}$ refresh stage to the single-level adjustment information of the $(i-n)^{th}$ refresh stage to obtain another cycle information,
wherein the step of determining the phase adjustment information based on the cycle information at the $i^{th}$ refresh stage comprises:
determining the phase adjustment information based on the cycle information and the another cycle information at the $i^{th}$ refresh stage.

16. The clock recovery method as claimed in claim 14, wherein the step of generating the phase control signal based on the phase adjustment information at the quiet stages of the low power idle mode, such that the clock generator adjusts the phase of the sampling clock in response to receiving the phase control signal at the quiet stages, comprises:
generating a second pulse signal based on the phase adjustment information at the quiet stages, wherein the second pulse signal comprises a second advanced pulse or a second retreated pulse; and generating the phase control signal based on the second pulse signal, such that the clock generator adjusts the phase of the sampling clock in response to receiving the second advanced pulse or the second retreated pulse at the quiet stages.

17. The clock recovery method as claimed in claim 16, wherein the step of generating the second pulse signal based on the phase adjustment information at the quiet stages comprises:

generating the second pulse signal based on the phase adjustment information determined at the $i^{th}$ refresh stage from the $(i+1)^{th}$ quiet stage to the $(i+n)^{th}$ quiet stage.

* * * * *